United States Patent
Norsworthy

Patent Number: 5,252,819
Date of Patent: Oct. 12, 1993

[54] SCANNING SENSOR PROCESSING APPARATUS AND METHOD FOR PROVIDING CORRECTION OF OUTPUT SIGNAL DISTORTION

[75] Inventor: Keith H. Norsworthy, Bellevue, Wash.

[73] Assignee: The Boeing Company, Seattle, Wash.

[21] Appl. No.: 995,526

[22] Filed: Dec. 23, 1992

Related U.S. Application Data

[63] Continuation of Ser. No. 791,221, Nov. 13, 1991, abandoned.

[51] Int. Cl.$^5$ .............................................. H01J 40/14
[52] U.S. Cl. .................................... 250/208.2; 358/494
[58] Field of Search ............... 250/208.1, 208.2, 561, 250/234–236; 358/483, 493, 494

[56] References Cited

U.S. PATENT DOCUMENTS

| | | | |
|---|---|---|---|
| 4,044,241 | 8/1977 | Hatley, Jr. | 235/152 |
| 4,158,232 | 6/1979 | Koeth et al. | 364/724 |
| 4,377,793 | 3/1983 | Horna | 333/165 |
| 4,494,214 | 1/1985 | Bernard et al. | 364/724 |
| 4,519,084 | 5/1985 | Langseth | 375/14 |
| 4,728,804 | 3/1988 | Norsworthy | 250/578 |
| 4,767,937 | 8/1988 | Norsworthy | 250/578 |
| 4,776,031 | 10/1988 | Mita | 358/483 |
| 4,780,761 | 10/1988 | Daly et al. | 358/133 |
| 4,783,660 | 11/1988 | Pierce | 342/101 |
| 4,827,443 | 5/1989 | Meerkotter et al. | 364/724 |
| 4,829,463 | 5/1989 | Kakishita et al. | 364/724 |
| 4,856,031 | 8/1989 | Goldstein | 375/118 |
| 5,121,230 | 6/1992 | Honma et al. | 358/494 |

Primary Examiner—David C. Nelms
Assistant Examiner—Stephone Allen
Attorney, Agent, or Firm—Finnegan, Henderson, Farabow, Garrett & Dunner

[57] ABSTRACT

A scanning sensor system for simultaneously correcting time varying view angle errors and suppressing sensor noise. The system comprises a scanning sensor producing a sensor output signal corresponding to an actual view angle which differs from a desired view angle by a jitter angle error. The jitter angle error is detected by a detector and a corresponding jitter error signal is generated. Data samples of the sensor output signal are sequentially stored in a data memory. The system also comprises a coefficient memory for storing a plurality of sets of weighting coefficients, each weighting coefficient set being defined by a noise suppression filter impulse response. One of the plurality of weighting coefficient sets is selected in accordance with the jitter error signal following which each one of the sequentially stored data samples is multiplied by a respective weighting coefficient from the selected set of weighting coefficients. Finally, a corrected sensor output signal is generated by summing the results of these multiplication products.

21 Claims, 15 Drawing Sheets

SEPARATE INTERPOLATION AND FILTERING

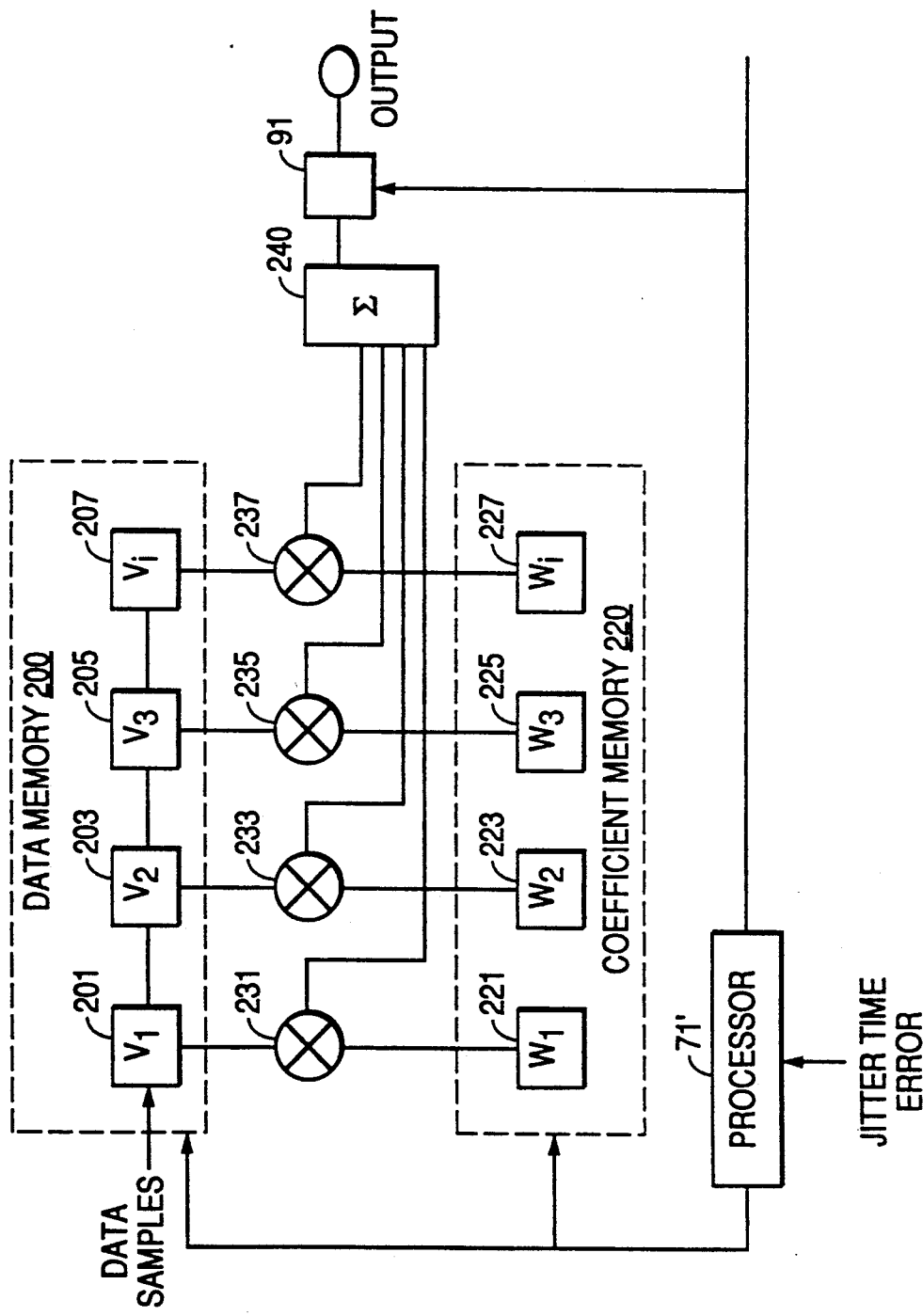

SCANNING SENSOR PROCESSING APPARATUS AND METHOD FOR PROVIDING CORRECTION OF OUTPUT SIGNAL DISTORTION

This application is a continuation of application Ser. No. 07/791,221, filed Nov. 13, 1991, now abandoned.

BACKGROUND OF THE INVENTION

The invention relates to sensor systems and, more particularly, to non-imaging, scanning sensor systems which simultaneously correct sensor output signal distortion caused by random sensor noise and temporal instabilities in the sensor scanning mechanism.

Non-imaging, scanning sensor systems are employed in many applications where it is desired to detect the presence of objects. For example, non-imaging scanning sensor systems employing an array of infrared detector elements positioned in a focal plane of a scanning optical system are used to passively detect the presence of objects at extended distances. The array is typically mounted on a gimballed sensor unit to scan a portion of a field of view and produce sensor output signals which are sampled and multiplexed for further processing by on-gimbal and off-gimbal circuitry.

Sensor output signals from the gimballed sensor unit can be degraded by distortion from a number of sources. Two of the largest and most common sources of sensor output signal distortion are timing, or temporal, instabilities in the sensor scanning mechanism, and random noise inherent in the sensor.

Temporal instabilities can arise in the output signal of scanning system sensor units from environmental stresses which induce undesired spatial displacement in the sensor scanning mechanism. Uncompensated spatial displacements can interrupt the linear scanning process of the scanning mechanism in the sensor unit. These discontinuities in the otherwise linear scanning process then cause temporal instabilities in the sensor output signal. Similarly, timing errors in the sampling circuitry of the sensor unit cause temporal instabilities in the sensor output signal. As a result, the actual view angle ($\theta$) for the sensor unit can be expressed by:

$$\theta(t)=kt+\Delta(t), \qquad (Eq. 1)$$

where k is a desired linear scan rate, and $\Delta$ is a jitter angle error component measured as a function of time, t.

Conventional signal processing typically employs one of two methods to derive a desired linear representation of the output signal provided by the sensor unit when it scans an actual (nonlinear) view angle. The two compensation methods use phase shifting of Fast Fourier Transforms (FFT) frequency components and interpolation between signal samples, respectively, to, in effect, remove the jitter angle error component $\Delta(t)$ from equation 1.

The method of phase shifting FFT frequency components is very complex. Actual signal samples are grouped into short "blocks" and processed through an FFT processor. The resulting FFT frequency components are phase rotated by a phase angle proportional to the product of the prevailing jitter angle and the FFT frequency component. After phase shifting has been applied to each FFT frequency component, an inverse FFT is performed to produce a desired "linear scan rate" representation of the sensor output signal.

This method, however, cannot compensate for rapidly changing jitter angle values, and the process of grouping the signal samples into blocks produces undesired "end-effects" which are difficult to accommodate. Accordingly, the method of phase shifting FFT frequency components is not practical in many scanning system applications.

Time interpolation between signal samples is a less complex method of compensating for temporal signal distortion and is adaptable to a greater range of scanning system applications. In this method, the actual sensor view angle is again denoted by:

$$\theta(t)=kt+\Delta(t), \text{ and} \qquad (Eq. 1)$$

a desired linear view angle is denoted by:

$$\theta'(t)=kt, \qquad (Eq. 2)$$

for a scanning system with a sensor output signal sampled at a constant rate to produce signal samples S(t). For each desired linear view angle $\theta'$, the two closest actual view angles are determined, e.g., ($\theta'-a$) which occurred at time $t_n$ and ($\theta'+b$) which occurred at time $t_{n+1}$.

The compensated signal sample output for the desired linear view $\theta$, is computed by two-point linear interpolation as shown below:

$$S'=S(t_n)+(1-X)\,S(t_{n+1}) \qquad (Eq. 3)$$

where S' is a desired signal sample corresponding to $\theta'$, and X is the degree of interpolation defined as X=b (a+b) for coefficients a and b discussed above.

This particular computation method of interpolation is satisfactory for processing conditions where the observed signal amplitude varies linearly with time, but yields poor results when the observed signal varies nonlinearly with time. To partially overcome this limitation, the interpolation process has been extended to include parabolic (or higher order) smoothing between three (or more) sample values. However, poor results remain for conditions where the observed signal amplitude is a highly nonlinear function of time.

An exemplary conventional circuit for performing interpolation is shown in FIG. 1. Data samples $V_i$ are taken, for example, from a sensor output signal at a sampling rate sufficient to satisfactorily depict regions of nonlinear variation in the sampled signal waveform. The number of data samples selected for interpolation is kept low, e.g. 2, to reduce circuit complexity, and because interpolation between greater than four data samples is usually ineffective. Data samples $V_i$ are sequentially received and shifted through locations 101, 103, 105, and 107 of data memory 100. Multiple sets of coefficients, according to the degree of interpolation required, are selected and stored in a coefficient register 120. Each set of coefficients contains N coefficients per set. For example, for linear interpolation between two data samples, N will equal 2, and the coefficients are computed as X and 1−X, where X is the degree of interpolation desired. In other cases, N is made equal to 4 and coefficients are calculated to yield quadratic smoothing over four data samples. Higher order smoothing requires N to be even higher.

If the degree of interpolation required is constant, the set of coefficients is also constant. However, if the degree of required interpolation changes with time, the selected set of coefficients is made to change with time. This change is typically accomplished by shifting the coefficient register 120 to the left or right according to the change in the degree of interpolation.

The data samples, $V_1$, $V_2$, $V_3$, $V_i$ shifted into data memory locations 101, 103, 105, 107 are multiplied by coefficients selected from coefficient register 120 in multipliers 131, 133, 135, 137, respectively. The resulting multiplicative results are then summed in summer 140 to form an interpolation output.

This method, referred to here as "dancing" interpolation does not, however, work as well as desired. Perfect interpolation would provide a frequency transfer function of:

$$1.0 \, e^{(j2\pi X f T)} \qquad \text{(Eq. 4)}$$

where X is the degree of interpolation, f is the frequency of the input signal and T is the sample period. The results of this transfer function would leave the amplitude of a frequency component unchanged while shifting its phase by ($\beta = 2\pi X f T$). In contrast, the two point linear interpolation method (N=2) discussed above provides an amplitude gain of $$[X^2 + (1-X)^2 + 2X(1-X)\cos\beta]^{\frac{1}{2}}$$

and a phase shift of $$\text{Arctan} \frac{X \sin \beta}{(1 - X) + X \cos \beta}.$$

Other interpolation methods also fail to provide the desired frequency transfer function.

In addition to distortion caused by temporal instabilities in the sensor scanning unit, sensor output signals are degraded with random noise. To suppress this noise and thereby better define the desired sensor output signal waveform, data samples $V_i$ are typically processed through a conventional convolution filter.

An exemplary circuit of a conventional sampled data convolution filter is shown in FIG. 2. Data samples $V_i$ are sequentially received and shifted through data memory 200. In operation, data samples $V_1$, $V_2$, $V_3$ ... $V_i$ stored in data memory locations 201, 203, 205, 207 are multiplied by corresponding weighting coefficients $W_1$, $W_2$, $W_3$ ... $W_n$ stored in coefficient memory locations 221, 223, 225, 227 in respective multipliers 231, 233, 235 237. The resulting multiplicative results are then summed in summer 240 to provide the convolution filter output.

Conventional convolution filters perform weighting and summing operations on successive input data samples to produce filtered replicas, y(n), of the input data samples, generally defined by the equation $$y(n) = \sum_{i=0}^{k} a_i V(n - 1) - \sum_{i=1}^{k} b_i y(n - 1) \qquad \text{(Eq. 5)}$$

The factors $a_i$ and $b_i$ are weighting coefficients applied to delayed input and output samples V(n-i) and y(n-i), respectively, where i connotes the number of sample delay periods. Equation 5 defines the transfer function of a recursive filter. If the rightmost term of the equation is eliminated, the equation defines the transfer function of a non-recursive filter herein called a convolution filter.

The convolution filter of FIG. 2 is known to suppress the random noise component of an input waveform and thereby produce a reduced noise output waveform. It will be readily appreciated that the transfer function of the convolution filter of FIG. 2 can be altered by changing the values of the weighting coefficients $W_n$, which correspond to $a_i$ in equation 5. In convolution filters, the time phase of a frequency component in the output waveform is related, in a known way, to the time phase of that frequency component in the input waveform. In other words, the output waveform is deterministically related to the input waveform and, so long as the sample rate satisfies the Nyquist theorem, this relationship is independent of the phasing of data samples taken from the input waveform.

For sensor output signals containing distortion caused by temporal instabilities and random noise, conventional signal processing methods require the sensor output signal to serially pass through interpolation and convolution filtering circuits, as shown in FIG. 3. Such a cascade of circuits, however, realizes imperfect interpolation and substantially increases overall circuit complexity.

In light of the foregoing discussion, it is desirable to provide a scanning sensor apparatus and method incorporating a system which simultaneously compensates for sensor output signal distortion produced by temporal instabilities and suppresses random sensor noise. It is further desirable to provide a method whereby improved interpolation of the sensor output signal is achieved when performed integral to a sampled-data convolution filter process. Additionally, it is desirable to provide an apparatus which is more convenient to implement and which provides improved jitter compensation for all spatial frequencies despite the presences of a rapidly changing jitter error angle.

Additional advantages of the invention will be set forth in part in the description which follows and in part will be obvious from the description, or may be learned by practice of the invention. The invention may be realized and attained by means of the instrumentalities and combinations particularly pointed out in the appended claims.

SUMMARY OF THE INVENTION

The invention in one aspect comprises a scanning sensor system for simultaneously correcting time varying view angle errors and suppressing sensor noise. The system comprises a scanning sensor producing a sensor output signal corresponding to an actual view angle which differs from a desired view angle by a jitter angle error, means for detecting the jitter angle error and for generating a jitter error signal corresponding to the detected jitter angle error, and data memory means for sequentially storing data samples of the sensor output signal. The system also comprises coefficient memory means for storing a plurality of sets of weighting coefficients, each weighting coefficient set being defined by a noise suppression filter impulse response; means for selecting one of the plurality of weighting coefficient sets in accordance with the jitter error signal; means for multiplying each of the sequentially stored data samples by a respective weighting coefficient from the selected set of weighting coefficients; and means for generating a corrected sensor output signal by summing results from the multiplying means.

In another aspect of the present invention, the system comprises a scanning sensor producing a sensor output signal corresponding to an actual view angle which differs from a desired view angle by a jitter angle error; means for sampling the sensor output signal at a predetermined sample interval n such that a plurality of data samples $V_1-V_i$ are provided for corresponding sample intervals $n_1-n_i$; a data memory for storing data samples $V_1-V_i$; means for selecting a set of k data samples from the stored data samples $V_1-V_i$; and means for detecting the jitter angle error, and for generating a jitter time error signal M(n) corresponding to the detected jitter angle error, the jitter time error signal including an integer portion $IP_n$, corresponding to a nearest integer multiple of the sample interval, and a fractional portion $FP_n$, less than the sample interval. The system also comprises coefficient memory means for storing a plurality of weighting coefficient sets, each weighting coefficient set being defined by a noise suppression filter impulse response; means for selecting a weighting coefficient W(n) from the plurality of weighting coefficient set for each respective data sample V(n) of the selected set of k data samples; means for multiplying each respective data sample V(n) by the respective selected weighting coefficient W(n); and means for generating a corrected sensor output signal from the products of the multiplying means.

Yet another aspect of the present invention comprises a method of simultaneously correcting time varying view angle errors and suppressing sensor noise in a sensor output signal of a scanning sensor system. The method comprises the steps of detecting a jitter error angle as the difference between an actual view angle and a desired view angle for the scanning sensor system; generating a jitter error signal corresponding to the detected jitter angle error; storing data samples of the sensor output signal in a data memory; selecting one of a plurality of stored weighting coefficient sets in accordance with the jitte error signal, each weighting coefficient set corresponding to a noise suppression filter impulse response; multiplying each stored data sample by a respective weighting coefficient from the selected set of weighting coefficients; and generating a corrected sensor output signal by summing the multiplicative results.

In still another aspect of the present invention, the method comprises the steps of sampling the sensor output signal at the sample interval n, such that a plurality of data samples $V_1-V_i$ are provided for corresponding sample intervals $n_1-n_i$; storing data samples $V_1-V_i$ in a data memory; selecting a set of k data samples from the stored data samples $V_1-V_i$; detecting a jitter angle error as the difference between an actual view angle and a desired view angle; generating a jitter time error signal M(n) corresponding to the detected jitter angle error, the jitter time error signal including an integer portion $IP_n$ corresponding to a nearest integer multiple of the sample interval and a fractional portion $FP_n$ less than the sample interval; selecting a weighting coefficient W(n) from a plurality of stored weighting coefficient sets for each respective data sample V(n) of the selected set of k data samples, each weighting coefficient set being defined by a noise suppression filter impulse response; multiplying each respective data sample V(n) of the selected set of k data samples by the respective selected weighting coefficient W(n); and generating a corrected sensor output signal from the multiplicative results.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIG. 10 is a more detailed diagram of a filter circuit included in a second embodiment of the present invention;

DESCRIPTION OF THE PREFERRED EMBODIMENT

Figure 1:
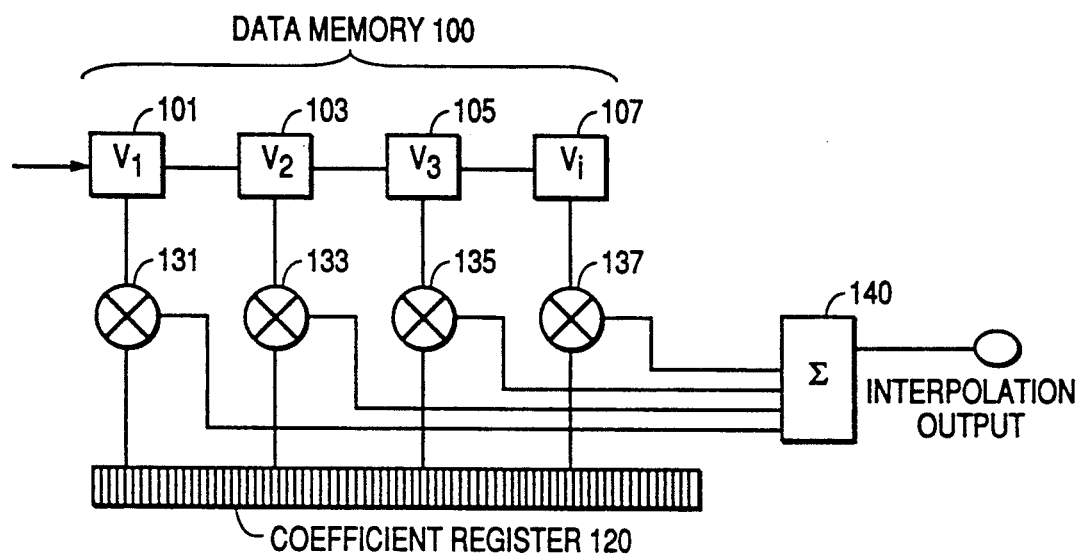
FIG. 1 is a diagram of filter employing interpolation techniques.
Figure 2:
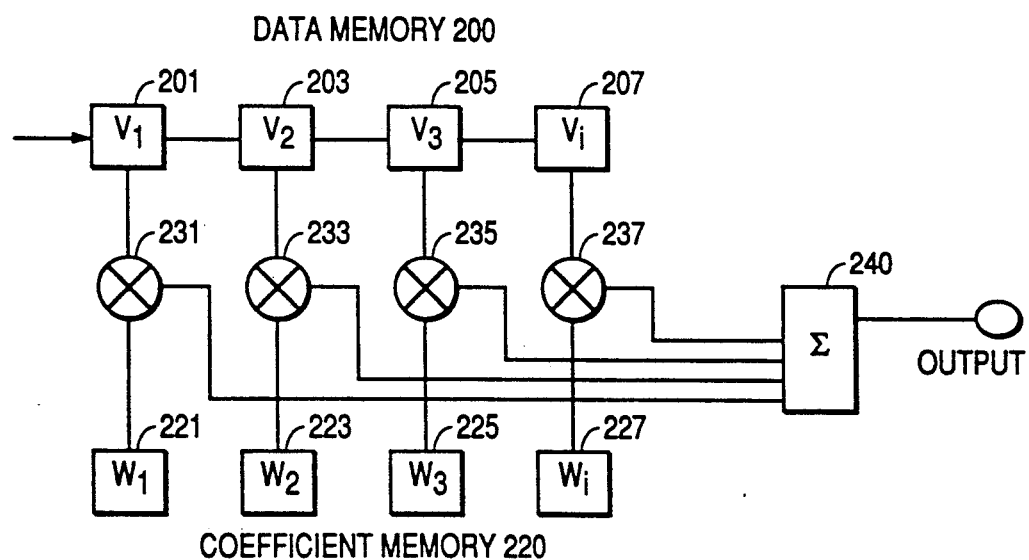
FIG. 2 is a diagram of a filter employing convolution techniques.
Figure 3:
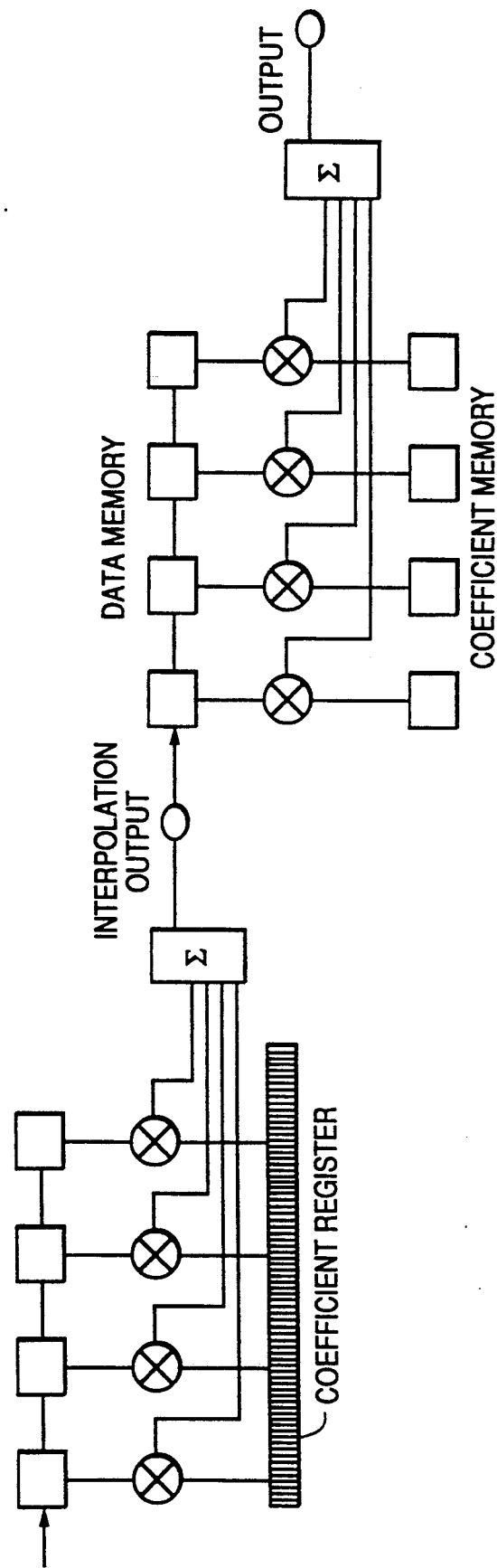
FIG. 3 is a diagram of a filter employing serial interpolation and convolution techniques.

Reference will now be made in detail to present preferred embodiments of the invention, examples of which are illustrated in the accompanying drawings. In the drawings, corresponding reference characters refer to corresponding elements.

Figure 4:
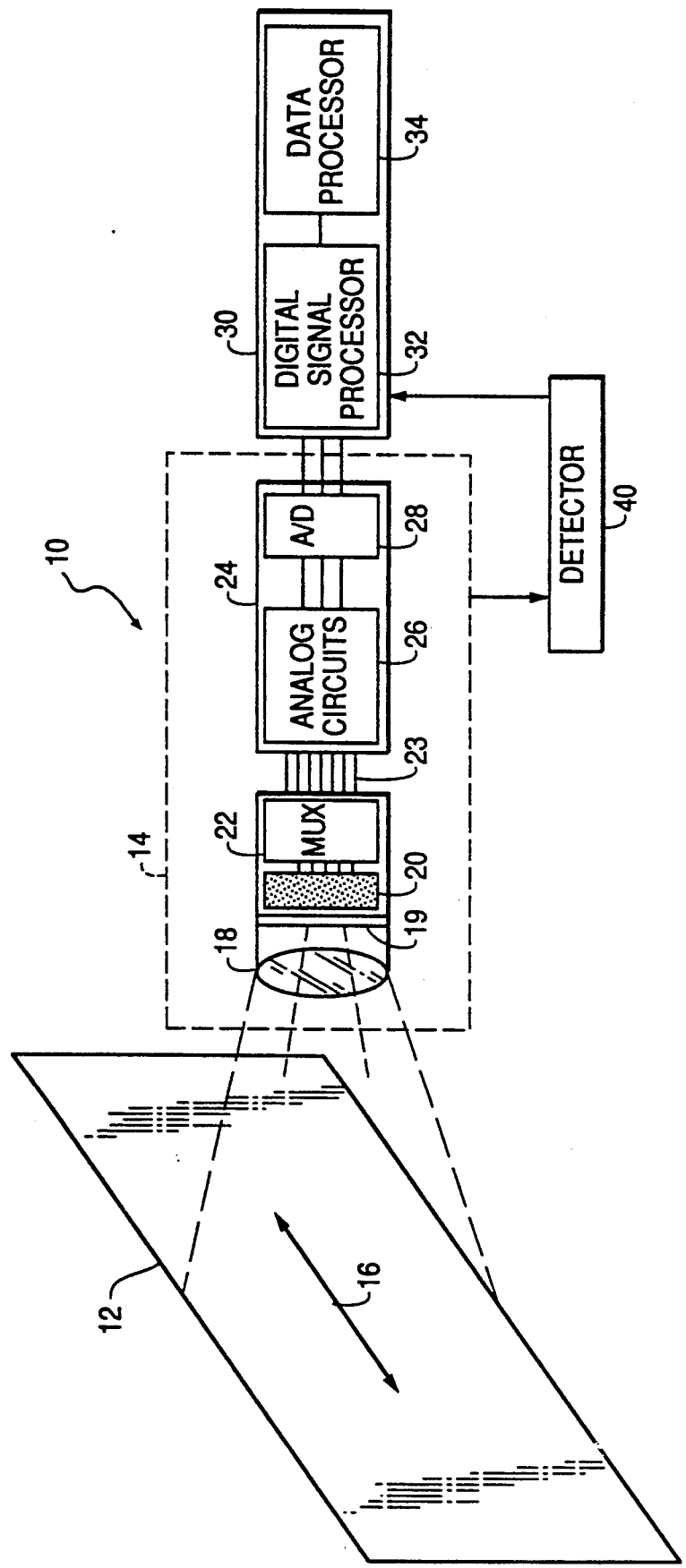
FIG. 4 shows a scanning system employing a preferred embodiment of the present invention.

FIG. 4 shows a scanning system 10 designed to detect objects at extended distances over a two-dimensional field of view 12. System 10 includes a sensor unit 14 movably mounted on gimbals (not shown) so as to scan in a direction indicated by arrow 16 to cover field of view 12. Sensor unit 14 includes an optical system indicated schematically at 18 which projects a portion of field of view 12 onto a focal plane 19. Positioned at focal plane 19 is an array 20 of infrared detector elements and associated processing circuitry. Typical arrays 20 may consist of hundreds or even thousands of individual detector elements.

The output of detector elements of array 20 are connected through multiplexing circuitry 22 over interconnect cables 23 to circuitry 24. Circuitry 24 is mounted in movable sensor unit 14 and is thus referred to as on-gimbal circuitry. On-gimbal circuitry 24 includes analog signal processing circuitry 26 which amplifies and processes signals received over interconnect cables 23. The output of analog circuitry 26 is then supplied to analog-to-digital converter circuitry 28 which converts the signals to digital quantities and transmits data from senso unit 14 to off-gimbal processing circuitry 30 which may include a digital signal processor 32 and additional data processing circuitry 34 for analyzing information obtained by sensor unit 14.

A jitter angle error detector 40 detects sensor view angle errors caused, for example, by temporal instabilities in the sensor scanning mechanism or timing errors in the sampling circuitry of the analog-to-digital converter circuitry 28. The construction of detector 40 is known in the art. In one example of a jitter angle error detector, a laser beam is transmitted through an optical train and impinges on auxiliary detector elements that measure the jitter angles induced by structural vibrations in the optics mounting. In another example, an angular accelerometer is mounted on the focal plane of the scanning sensor to measure deviations from the desired linear scan rate induced by platform rotation irregularities.

Figure 5:
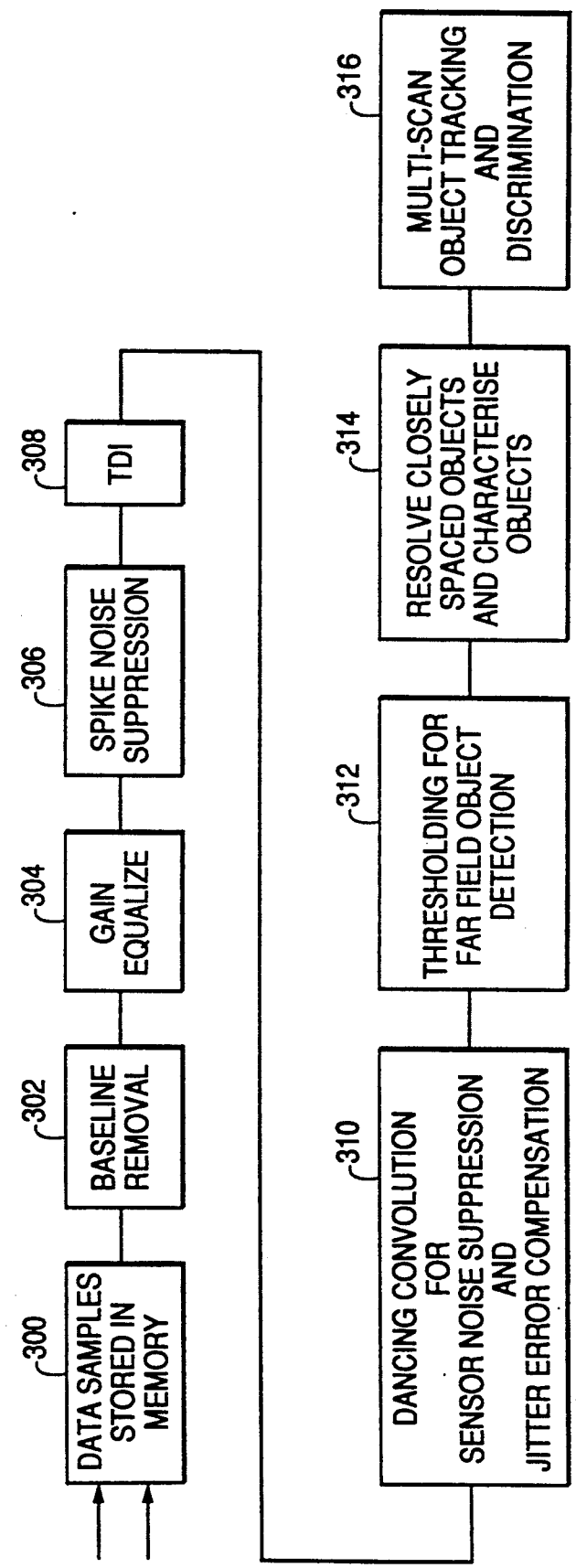
FIG. 5 shows a digital signal processor employing a preferred embodiment of the present invention.

Digital signal processor 32 typically consists of the functional elements shown in FIG. 5. Data samples derived from the scanning sensor output are stored in memory 300. Before be-ing corrected for distortion in filter 310, data signals are processed through a baseline remover 302, a gain equalizer 304, and a spike noise suppressor 306. Additionally, data samples are grouped via time-delay summation in a time delay integrator (TDI) 308. The process of simultaneous noise suppression and jitter error compensation performed in filter 310 is discussed in detail below. Signals then undergo object detection by a thresholding circuit 312, object resolution by circuit 314, and object tracking and discrimination by circuit 316.

Figure 6:
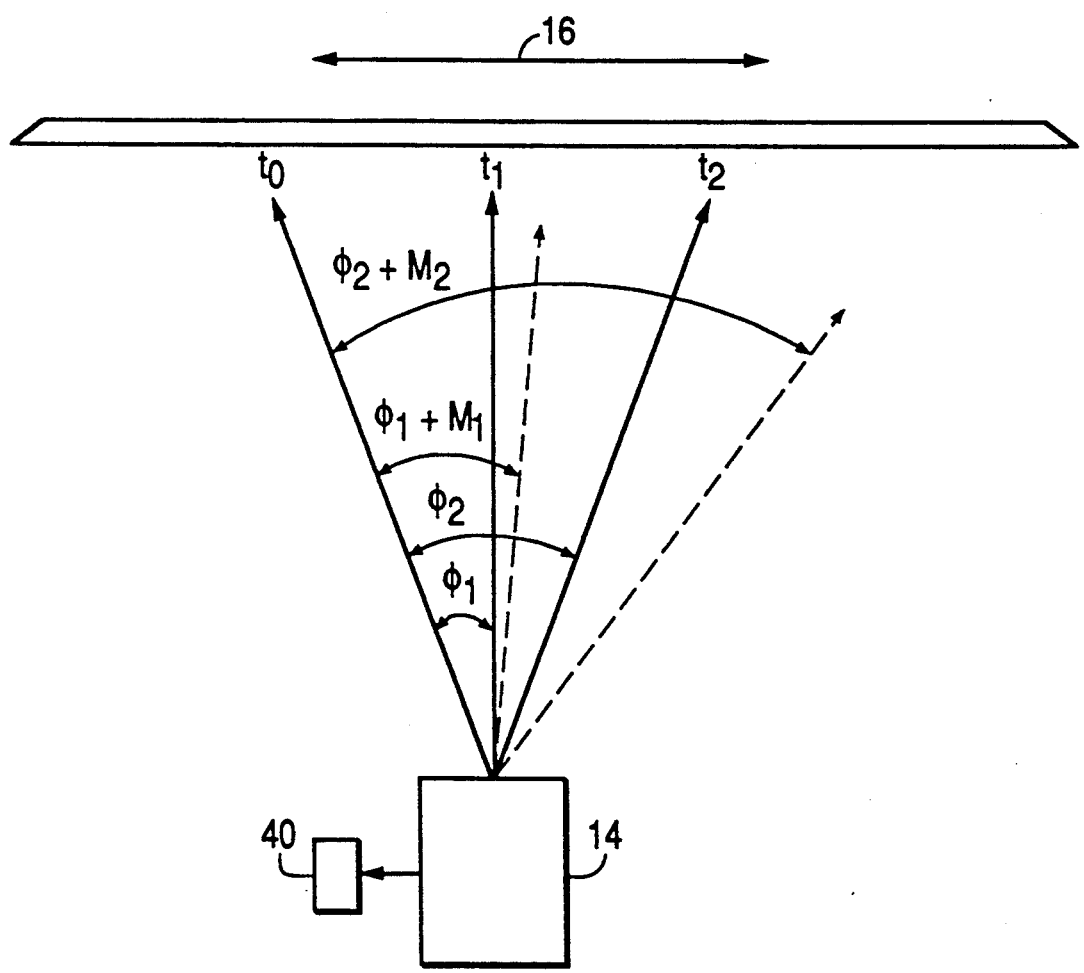
FIG. 6 is a diagram illustrating view angle errors to which systems of the type shown in FIG. 4 are susceptible.

FIG. 6 illustrates view angle errors to which the apparatus of the type shown in FIG. 4 is susceptible. As shown by the solid vectors in FIG. 6, for example, at time $t_1$, the sensor unit 14 has scanned a desired view angle $\theta_1$ as measured from a point in the field of view 16 at time $t_o$. Likewise, at time $t_2$, the sensor unit 14 has scanned to a desired view angle $\theta_2$ as measured from the point in the field of view 16 at time $t_o$. In an ideal case for $(t_1-t_o)=(t_1-t_2)$, a linear scanning system would produce $\theta_2=2\theta_1$. However, sensor unit 14 is subject to uncompensated temporal instabilities, and the actual view angle, as shown by the dashed vectors, will vary from the desired view angle by a time varying angle error component ($\Delta$). Thus, the actual view at time $t_1$ is $\theta_1+\Delta_1$ and at time $t_2$ is $\theta_2+\Delta_2$.

In this example, jitter error detector 40 detects the view angle error component for each sample period ($n_0$, $n_1$, $n_2$ ... at times $t_0$, $t_1$, $t_2$ ...) and generates a jitter angle error signal corresponding to the magnitude of the view angle error component. This jitter angle error signal is converted to a jitter time error signal and provided to the digital signal processor 32. Jitter time errors are calculated from a desired scan rate of the sensor expressed in $\theta'$ angle units per sample interval. View angle errors $\Delta_{(n)}$ actually measured at sample intervals, n, are divided by $\theta'$ to yield time errors $M_{(n)}$.

Figure 7:
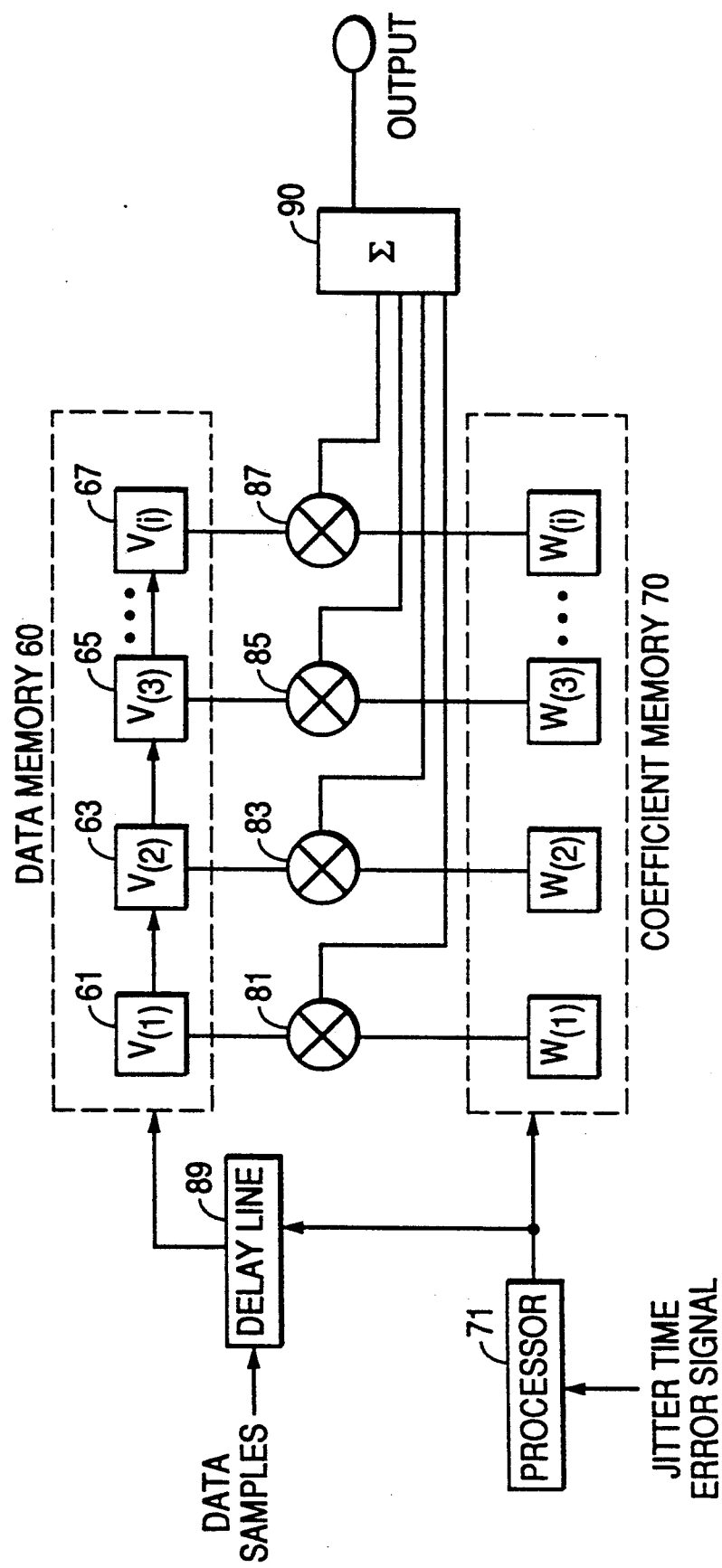
FIG. 7 is a diagram of a filter circuit included in a first embodiment of the present invention.

FIG. 7 is a detailed view of a circuit which is a first embodiment of the present invention. Data samples $V_1$, $V_2$, $V_3$ ... $V_i$ having previously been derived from the output of the sensor unit and processed through the initial functions of digital signal processor 32 are sequentially shifted into data memory locations 61, 63, 65 ... 67 respectively. Coefficients $W_1$, $W_2$, $W_3$ ... $W_i$ are selected from coefficient memory 70 by the methods discussed below and multiplied with a respective data sample in multipliers 81, 83, 85 ... 87, to produce a successive stream of multiplicative results which are summed in summer 90.

The present invention recognizes that improved interpolation can be achieved if it is performed integral with the sample-data convolution filter process. According to a first embodiment of the present invention, jitter error compensation and noise sup-pression filtering using time varying weighting coefficients are performed in the circuit of FIG. 7 by selection of a complete set of coefficients, as determined by the jitter time error signal. This embodiment is directed towards applications in which jitter time error does not change over many sample intervals.

In the first embodiment of the present invention, a set of weighting coefficients are selected from a plurality of weighting coefficient sets stored in coefficient memory 70 of FIG. 7 by a processor 71, using a method described below. Processor 71 may be a general purpose processor such as a Motorola 68000, or a custom processor optimized for filter processing.

Figure 8A:
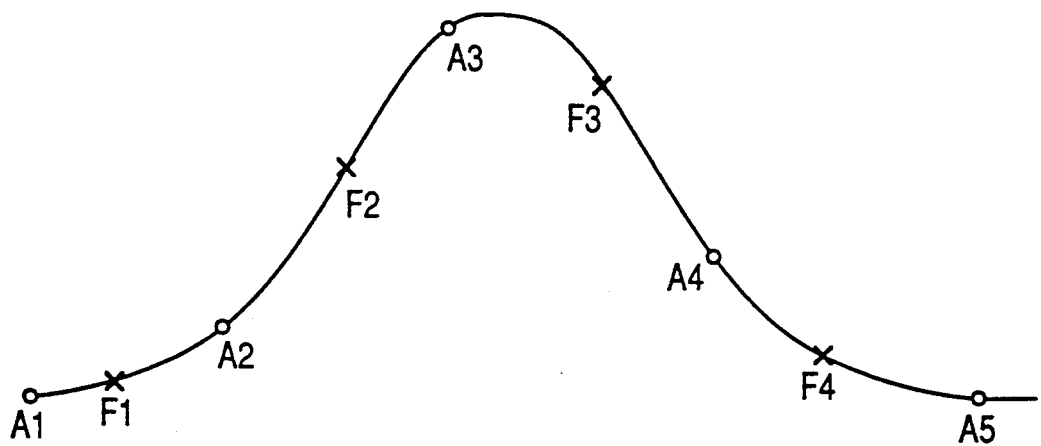
FIG. 8a shows coefficient values for a conventional noise suppression filter.

The respective values of the coefficients in the weighting coefficient sets stored in coefficient memory 70 are determined on the bases of the waveform expected as an output signal when the sensor scans over a far field point object. FIG. 8a shows, for example, a Gaussian waveform produced by a sensor unit scanning a typical target. The conventional noise suppression filter might use a set of five weighting coefficients chosen as values of the expected target waveform at the points marked by the circles "O" in FIG. 8a. Alternatively, the filter could equally well use a set of coefficients chosen as values of the expected target waveform at the points marked by crosses "X" in FIG. 8a. The two sets of coefficients give equal noise suppression performance, but the circle coefficients would delay the output target waveform by half a sample interval relative to the output target waveform obtained using the cross coefficients. These coefficients are used to weight input data samples according to the first part of equation 5.

Figure 8B:
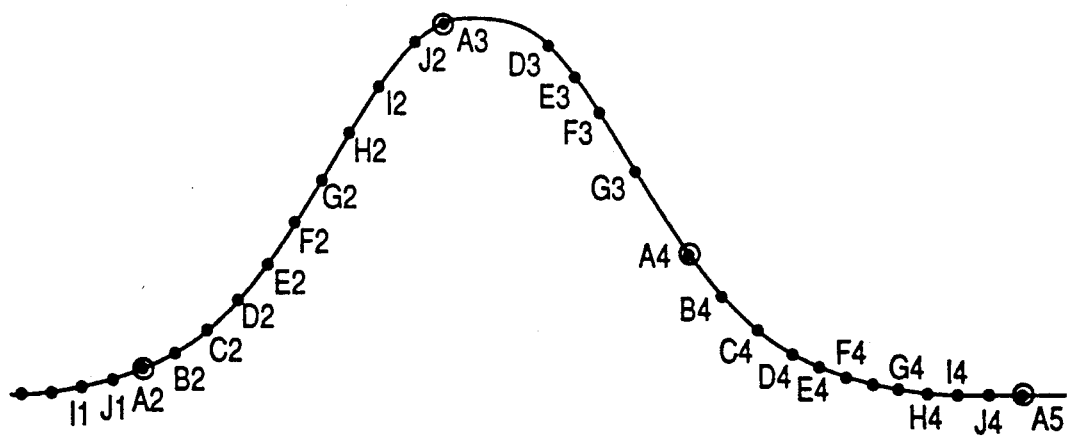
FIG. 8b shows sets of coefficient values stored by the first embodiment of the present invention.

In the first embodiment of the present invention, coefficient sets are stored in ROM for the "cross" and "circle" values and for a plurality of positions in between these values, as shown, for example, in FIG. 8b. Typically, ten sets of coefficients A-J are stored with relative separation corresponding to one tenth the sensor output signal sample interval, as shown in FIG. 8b, which is drawn with five coefficients 1-5 per set. The stored coefficients in each set are defined by the noise suppres-sion convolution filter impulse response. In practice, processor 71 of the first embodiment of the present invention selects a coefficient set, with the set selection being controlled by the jitter time error signal. It can be appreciated that if the sensor temporarily scans faster than the desired scan rate, compensation can be achieved by selecting a sequence of weighting coefficient sets, such as set C, set B and set A of FIG. 8b, which advances in time relative to a fixed set such as set C. Alternatively, or in conjunction with this compensation technique, delay lines 89 may be used to compensate for jitter time error. This technique will be described in detail with reference again to the apparatus shown in FIG. 7.

In FIG. 7, delayed data samples $V_1$, $V_2$, $V_3$ ... $V_i$ are sequentially received for respective sampling periods (n) and stored by processor 71 in (n) locations of data memory 60. Respective weighting coefficients are read from a single weighting coefficient set stored in read-only-memory (ROM) 70 which contains multiple sets of weighting coefficients, each set containing a predetermined number of weighting coefficients. If the jitter error angle signal is stable, that is, relatively constant over many sample intervals, then the single set of weighting coefficients is retrieved from ROM and each weighting coefficient of the retrieved set is multiplied with a respective data sample in multipliers 81, 83, 85 . . . 87. The resulting set of multiplicative values is then summed in summer 90 to form an output.

In this process, the jitter time error may be expressed as an integer multiple of the sample interval n, that is an integer portion (IP), and as a fractional portion (FP) corresponding to the total jitter time error less the integer portion. Accordingly, using the compensation scheme for the jitter time error, processor 71 may select the appropriate set of weighting coefficients on the basis of the fractional portion and delay the input data samples by a time interval equal to the integer portion. Processor 71 may use the fractional portion to select or address the desired weighting coefficient set in ROM, for example, by means of a look-up table or by an intermediately calculated series of ROM address bits based on the value of the fractional portion.

Figure 9:
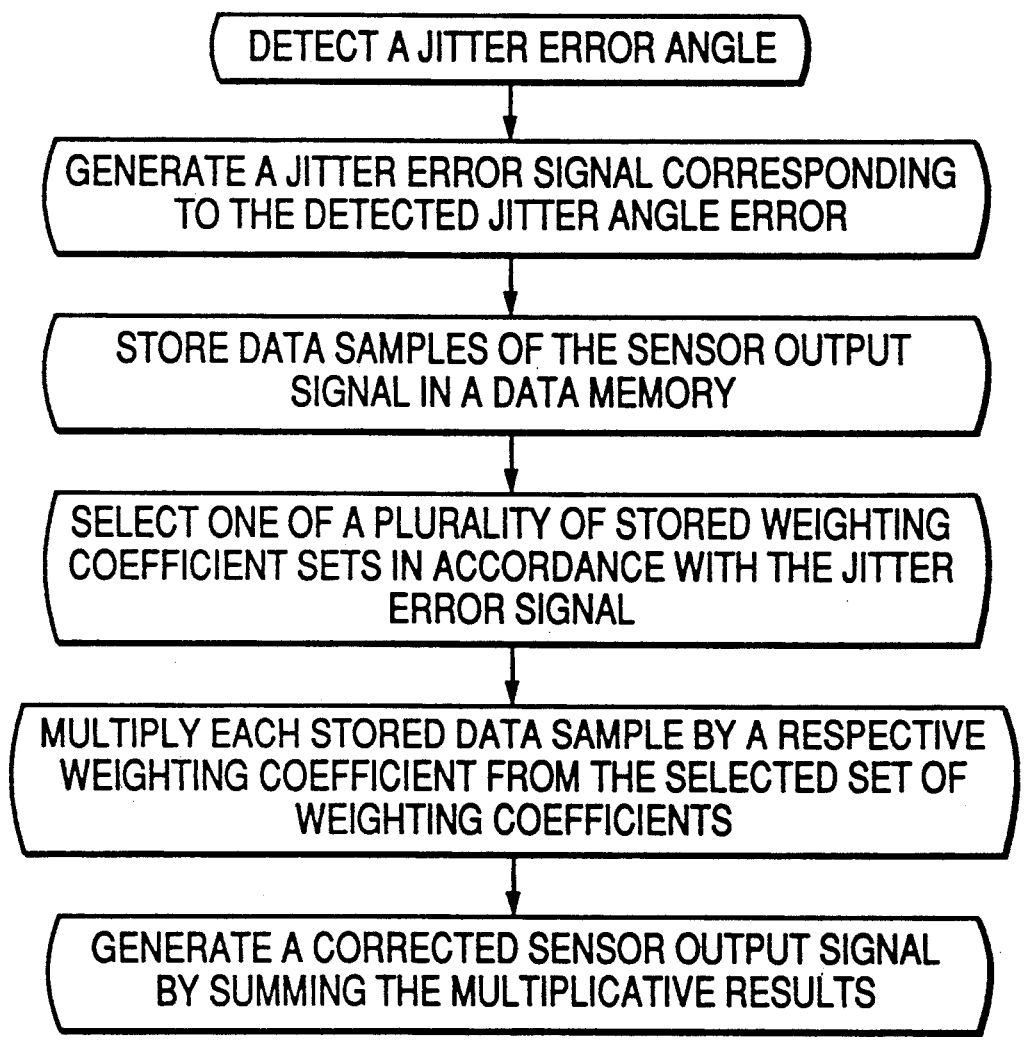
FIG. 9 is a flowchart further illustrating the first embodiment of the present invention.

Another aspect of the first embodiment of the present inven-tion is shown in the flowchart of FIG. 9. The method illustrated in this flowchart simultaneously corrects time varying errors and suppresses sensor noise by detecting a jitter error angle which is measured as the difference between an actual view angle and a desired view angle for the scanning sensor system (ST 401). A jitter error signal corresponding to the detected jitter angle error is generated (ST 402). Data samples taken from the sensor output signal are stored in a data memory (ST 403). One of a plurality of weighting coefficient sets stored in ROM is selected in accordance with the jitter error signal (ST 404). Each weighting coefficient set in the aforementioned plurality contains coefficients which correspond to a noise suppression filter impulse response. Each stored data sample is multiplied by a respective weighting coefficient from the selected set of weighting coefficients (ST 405). Finally, a corrected sensor output signal is formed by summing the respective multiplicative results (ST 406).

The second embodiment of the present invention is capable of compensating for very fast changes in the jitter angle errors. As with the first embodiment of the present invention, an impulse response for a desired noise suppression filter is defined for the second embodiment. Typically, the filter impulse response is defined to one tenth a sample interval, thus requiring ten sets of coefficients. These sets of weighting coefficients are stored in coefficient memory 220, ROM, as shown in FIG. 10. A maximum expected jitter time error M(n) is defined as $+/-M_{MAX}$ and a number of data samples V(n) are stored in data memory 200 by a processor 71' in consideration of $M_{MAX}$ and of a selected set of k data samples, which will be discussed below.

After a prerequisite number of data samples are stored in memory, processor 71' selects a subject data sample V(q). Thereafter, processor 71' selects k data samples defined by $V[q-IP(q)+r]$, where r has integer values in the range $+/- (k-1)2$, and where IP(q) is the integer portion of jitter time error M(q). Having thus selected a set of k data samples, processor 71' dynamically selects k weighting coefficients from up to several sets of weighting coefficients stored in ROM. Therefore, unlike the first embodiment, weighting coefficients can be selected from multiple weighting coefficient sets by the method described below. This ability to select from multiple weighting coefficient sets allows the second embodiment of the present invention to compensate for rapidly changing jitter time error.

As noted above, each one of the selected set of k data samples is shifted according to the integer portion $IP_{(q)}$ of the jitter time error M(q) for the subject data sample V(q). However, the k weighting coefficients respectively applied to the set of k data samples are selected by addressing in ROM according to the following equation:

$$\text{Address location} = [(k-IP(q))+M(q-IP(q)+k)] \quad \text{(Eq. 6)}$$

The derived ROM addresses are respectively related to the jitter time error of each data sample in selected set of k data samples, $(M(q-IP_q+r))$, and the integer portion $(IP_q)$ of the subject data sample V(q).

As will be shown with reference to Tables A-H, in the attached Appendix, the second embodiment provides excellent results for rapidly changing jitter angle errors. Throughout the Tables, n represents a sample interval, forty of which are assumed in these examples. Vo(n) denotes the sample values of an ideal Gaussian target waveform for each sample interval n. M(n) denotes the value of the jitter time error which has previously been derived from the jitter angle error signal for each sample interval ($n_1, n_2, n_3$. . .) corresponding to view angles at times ($t_1, t_2, t_3$ ...). IP(m) denotes integer portion of the jitter time error expressed to the nearest integer value of the sample interval n. V(n) denotes the value of the actual waveform data output from the sensor unit for each sample interval. W(n) denotes the weighting coefficients selected in response to the jitter time error. The selection of weighting coefficient W(n) will be discussed below.

The weighting coefficients W(n) shown in each of the Tables have been calculated, in each case, for a subject sample interval of n=20. The resulting output of the system is expressed as y(n). The output results y(n) are compared to y'(n) values for an ideal (no jitter) input waveform and y"(n) values for results that would have occurred if the actual input waveform values, V(n) were processed by a conventional noise suppression filter.

Figure 11A:
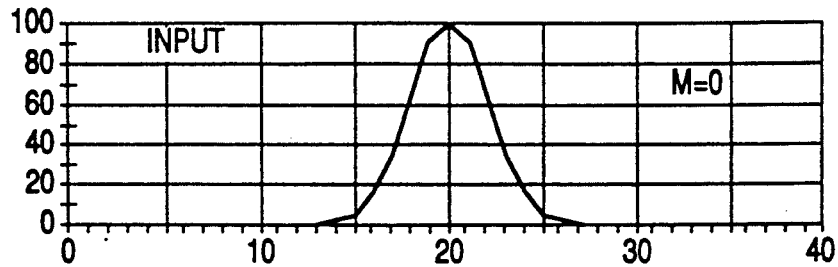
FIGS. 11A-11I are plots of various input waveform values for the filter of FIG. 6.
Figure 11A:
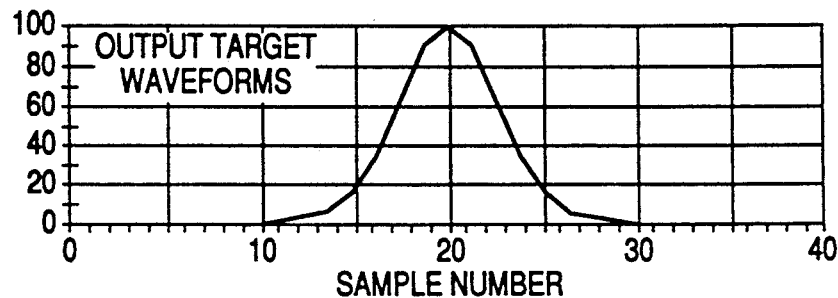
Figure 11B:
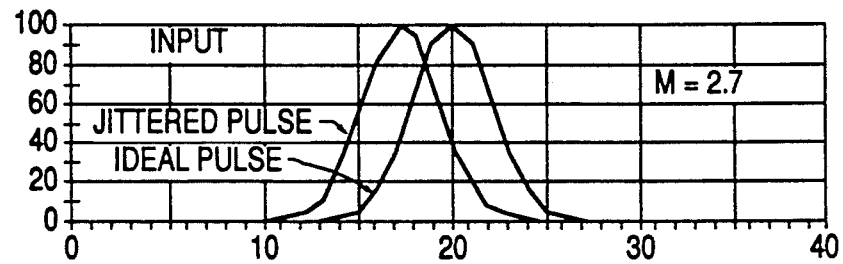
Figure 11B:
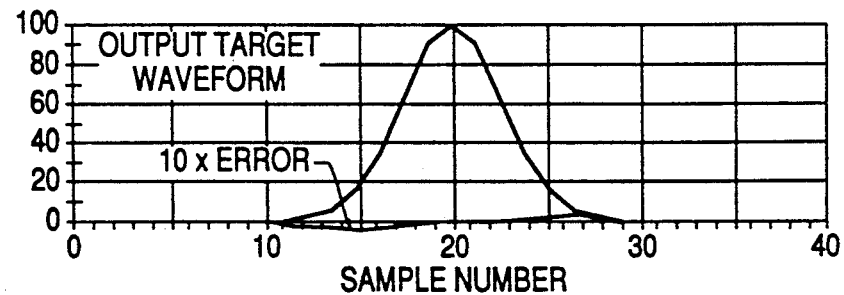
Figure 11C:
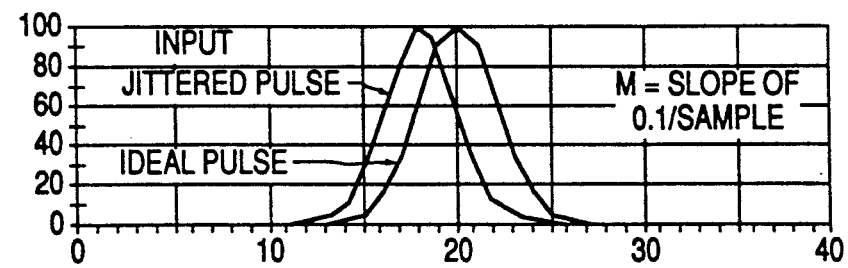
Figure 11C:
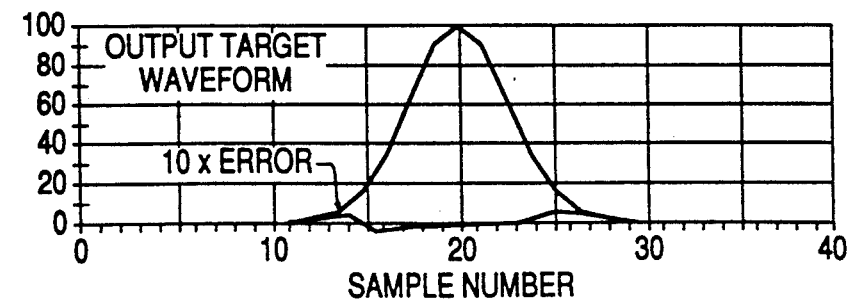
Figure 11D:
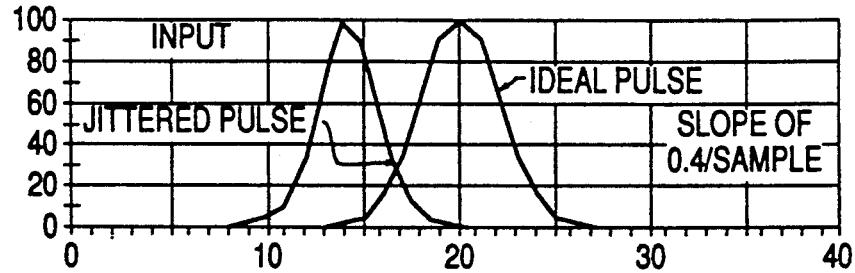
Figure 11D:
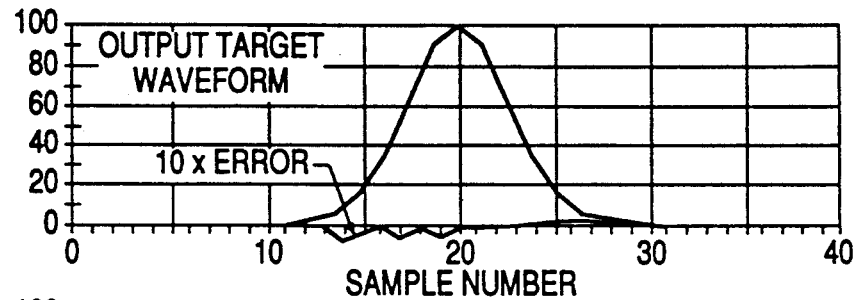
Figure 11E:
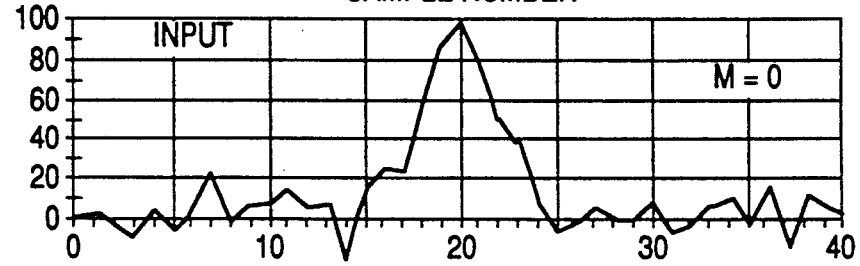
Figure 11E:
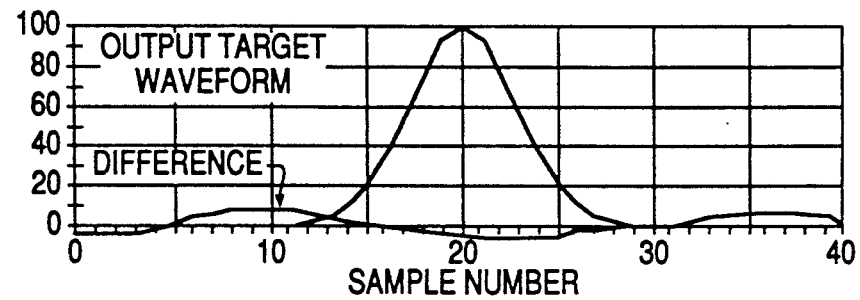
Figure 11F:
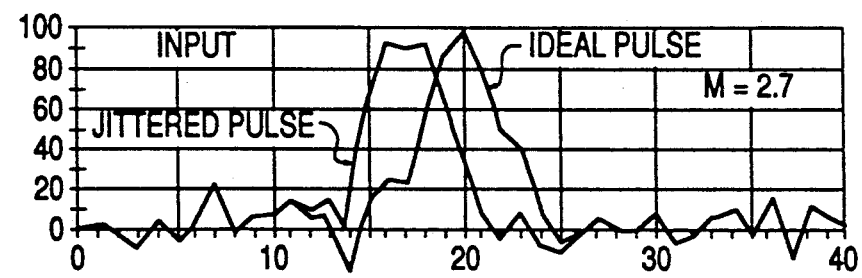
Figure 11F:
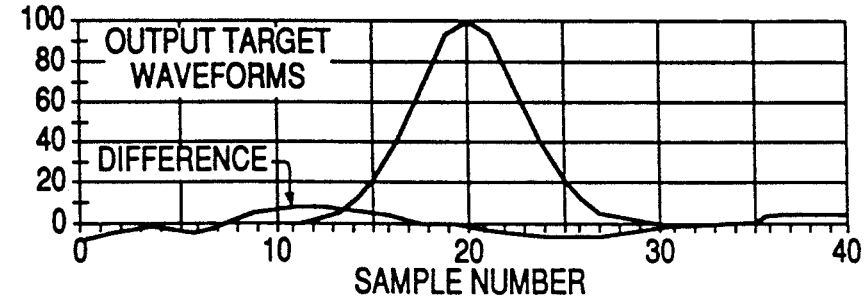
Figure 11G:
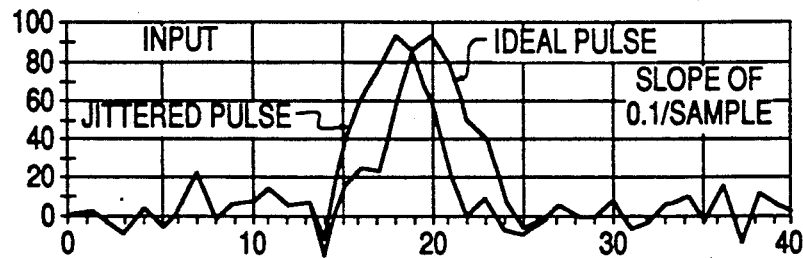
Figure 11G:
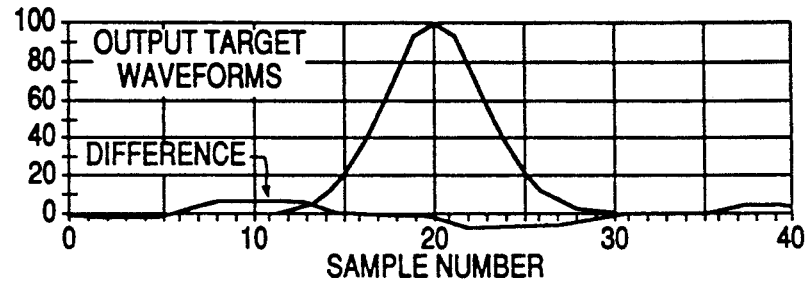
Figure 11H:
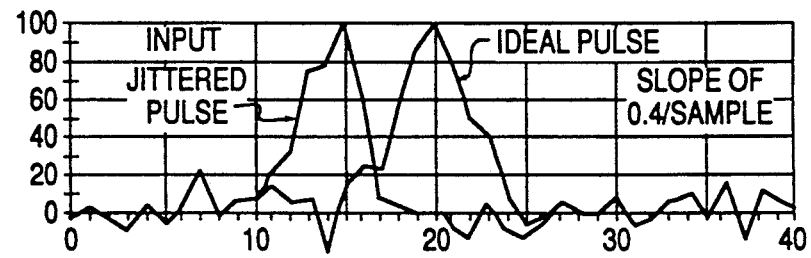
Figure 11H:
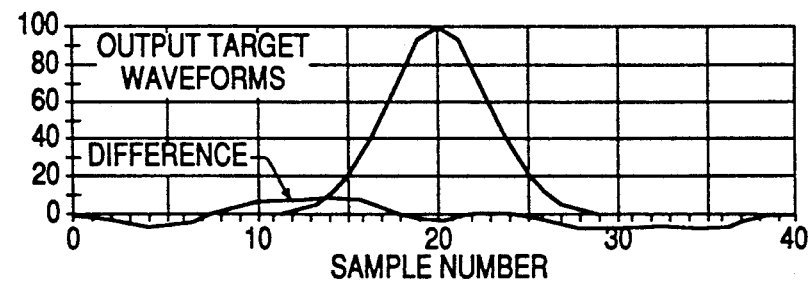
Figure 11I:
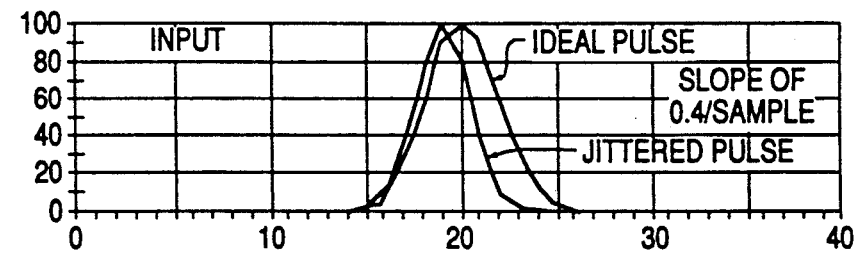
Figure 11I:
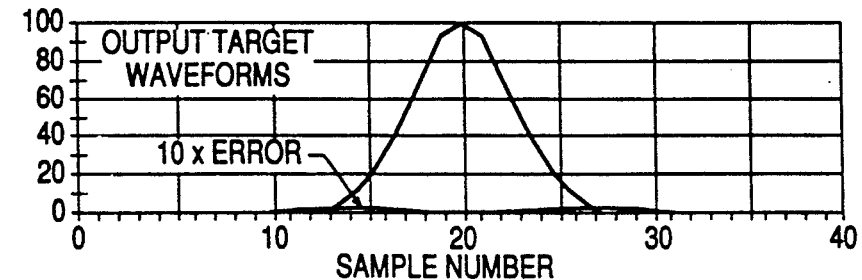

The actual input waveform set of values V(n) for each Table is shown in a corresponding plot in FIGS. 11A(a)-11H(a), and are shown compared to an ideal Gaussian input waveform. A second plot of the output waveform realized by the preferred embodiment of the present invention is also shown for each Table in FIGS. 11A(b)-11H(b). The difference between this output and the ideal output waveform is also shown at the bottom of each plot 11A(b)-11H(b) at ten (10) times the difference value, for ease in reading.

Table A shows the result of an input waveform with distortion M(n)=0. Table B shows the results of an input waveform with a constant distortion value, M(n)=2.7. In either of these cases, the first and second embodiments of the present invention will produce a single corresponding set of weighting coefficients to correct the jitter time error in the input waveform values V(n).

Table C shows the results of an input waveform with a changing jitter time error, where M(20)=2.0 and the jitter time error M(n) has a slope of 0.1/sample interval. Table D shows an even more extreme case of a changing jitter time error where M(20)=8.0 and the jitter time error M(n) has a slope of 0.4/sample interval.

Tables E-H are the same as A through D, respectively, with random noise added to the input waveform.

For each of the examples illustrated in Tables A-H, the preferred embodiment of the present invention computes y(n by reading, for each sample interval in a selected set of data samples, filter weiqhtinq coefficients from ROM. Weighting coefficients are addressed in ROM by the method and equation 6 previously described. For this example, k assumes integer values which range from $+/-5$ for the selected set of $(k=11)$ eleven weighting coefficients.

Figure 12:
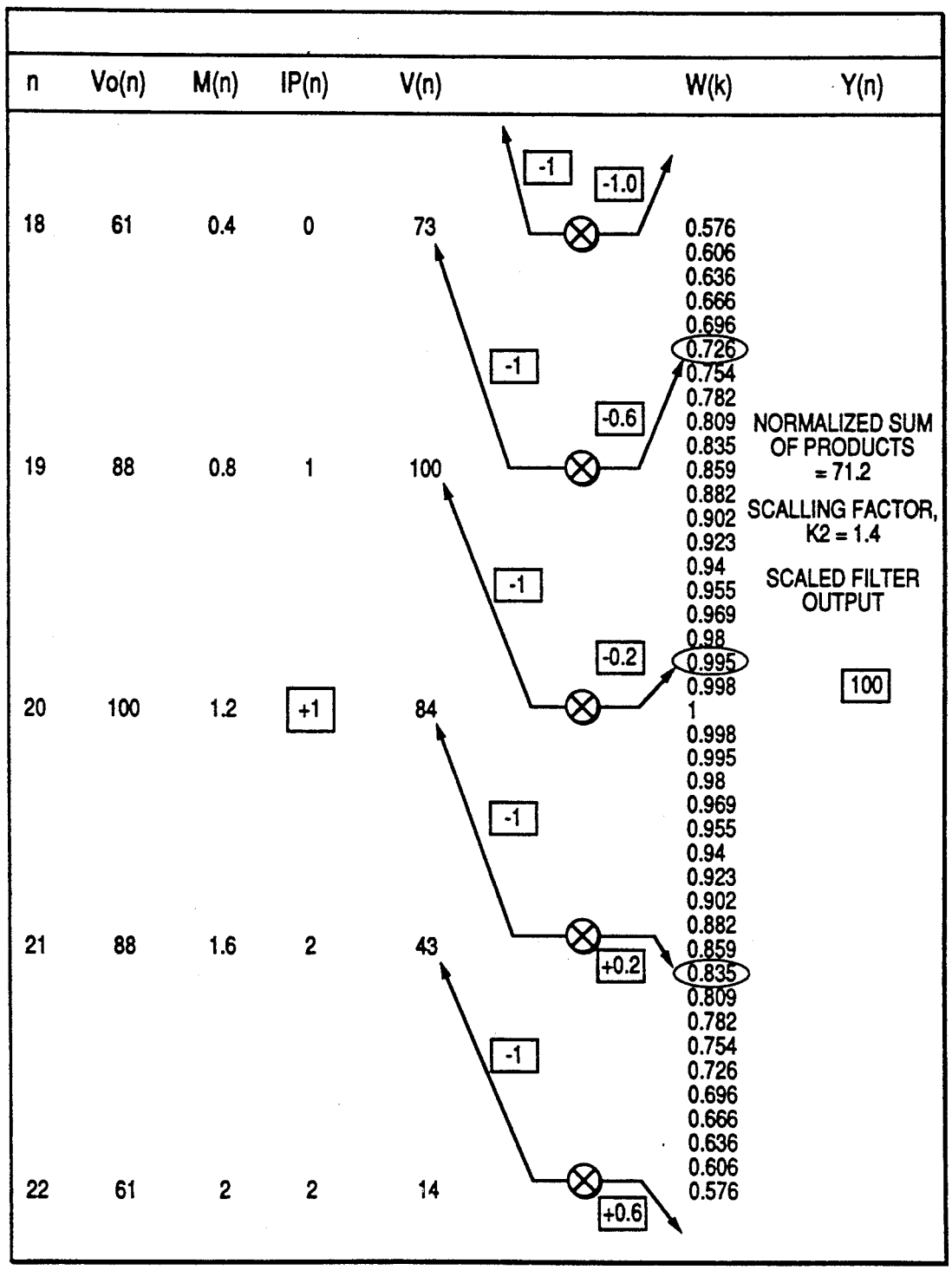
FIG. 12 is a diagram illustrating the calculation of coefficient values.

A detailed example of a method which constitutes an embodiment of the present invention is shown in FIG. 12, using an example chosen from Table I. Specifically, with respect to Table I where jitter time error $M(20)=1.2$ and has a slope of 0.4/sample interval, the set of coefficient values for $n=20$ is read from ROM addresses as calculated by equation 6 with $IP=1$ and k taking integral values between $+/-5$. For example when $k=0$ the weighting coefficient for the subject data sample interval $n=20$ is read from the ROM at an address location corresponding to:

$$= \{k - IP(n) + M[n + k - IP(n)]\}$$
$$= \{0 - 1 + M[20 + 0 - 1]\}$$
$$= -1 + 0.8 \text{ (where } M[19] = 0.8)$$
$$= -0.2$$

which in this particular case corresponds to a stored weighting coefficient of $W(k=o)=0.995$. Using the remaining ten values of k $(-5, -4, -3, -2, -1, 1, 2, 3, 4, 5)$ in equation 6 to derive ROM addresses, ten other weighting coefficients are addressed for a total of 11 weighting coefficients to be respectively applied to the selected set of 11 data samples around the subject data sample, q, $(n=20)$.

With the weighting coefficient set selected, the output value y(n) is determined by noting that the jitter error M(20) has an integer portion (IP) equal to 1. Sample data values are accordingly read from the data memory for sampling times $20-1+k$, where k again has eleven integral values between $+/-5$ as before. Each of these read data values is then multiplied by W(k) and the eleven multiplied values are summed to generate, in this example, a sum of products equal to 71.2 (after rounding).

In applications where the jitter time error changes rapidly, that is, in applications to which the second embodiment of the present invention is directed, a scaling factor may be required to compensate for the local rate of change of the time jitter error. Accordingly, processor 71' calculates and applies a scaling, or gain, factor to the sum of products output from summer 90. Element 91 shown in FIG. 10 is a multiplier or similar device capable of applying a scaling factor to the sum of products. The scaling factor, $F_s$, is calculated by:

$$F_s = \{1 + 0.25[M(n+2) - M(n-2)]\} \quad \text{(Eq. 7)}$$

Using the example values in FIG. 12 $F_s = 1 + 0.25 [2.0 - 0.4] = 1.4$, and the "scaled" sum of products value y(20) is $71.2 \times 1.4 = 100$ (after rounding), as indicated in Table I.

Figure 13:
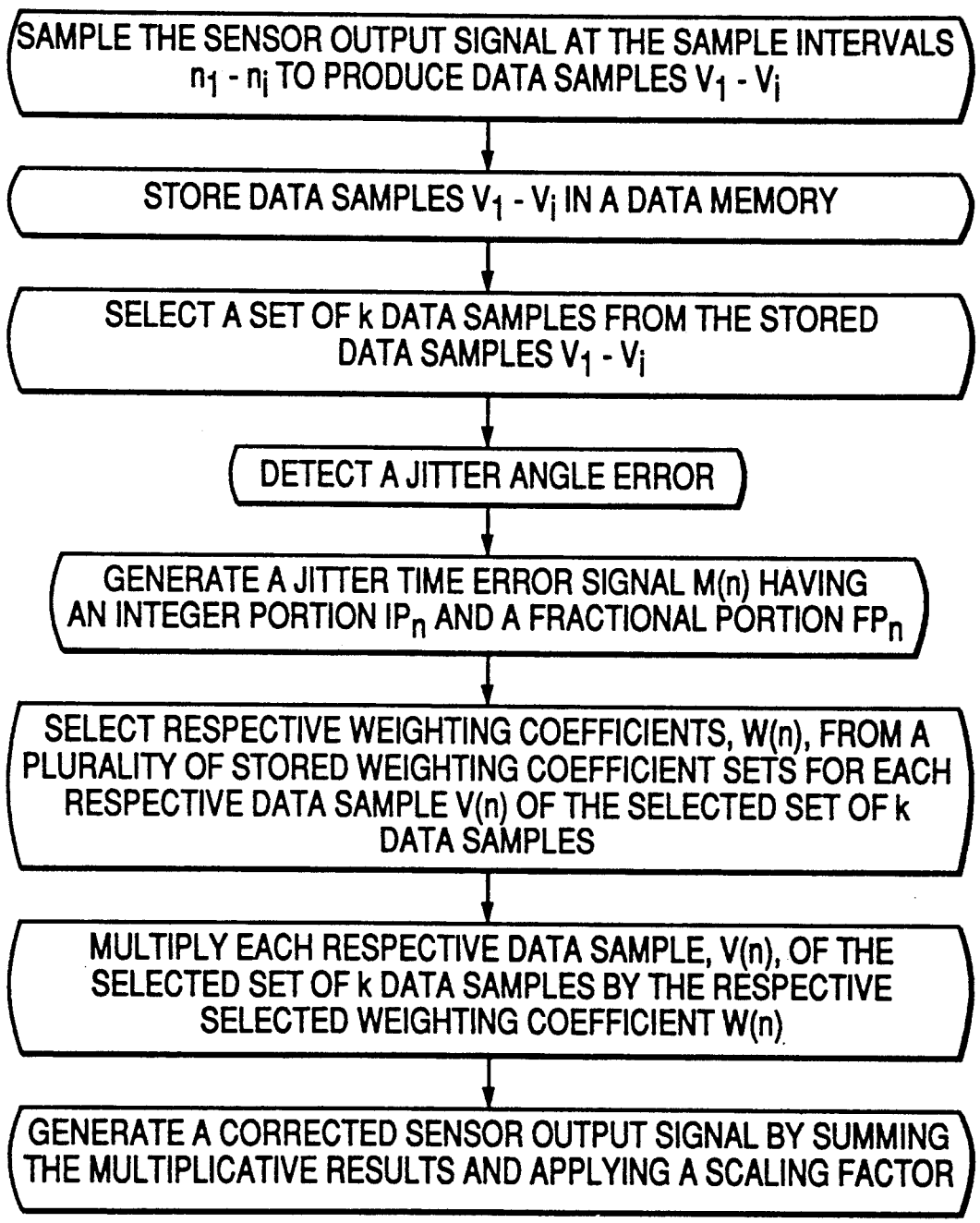
FIG. 13 is a flowchart illustrating another aspect of the second embodiment of the present invention.

A further aspect of the second embodiment of the present invention is shown in the flowchart of FIG. 13. The method illustrated in this flowchart simultaneously corrects time varying errors and suppresses sensor noise by sampling the sensor output signal at the sample interval n, such that a plurality of data samples $V_1-V_i$ are provided for corresponding sample intervals $n_1-n_i$ (ST 501). Data samples $V_1-V_i$ are stored in a data memory, typically a RAM (ST 502). A set of k data samples are selected from the stored data samples $V_1-V_i$ (ST 503). A jitter angle error is detected as the difference between an actual view angle and a desired view angle (ST 504). A jitter time error signal M(n) corresponding to the detected jitter angle error is generated wherein, the jitter time error signal including an integer portion IPn corresponding to a nearest integer multiple of the sample interval and a fractional portion $FP_n$ less than the sample interval (ST 505). Respective weighting coefficients, W(n), from a plurality of stored weighting coefficient sets are selected for each respective data sample V(n) of the selected set of k data samples (ST 506). Each weighting coefficient in the aforementioned plurality of sets is defined by a noise suppression filter impulse response. Each respective data sample, V(n), of the selected set of k data samples is multiplied by the respective selected weighting coefficient W(n) (ST 507). Finally, a corrected sensor output signal is generated by summing the multiplicative results and applying a scaling factor (ST 508).

Figure 14:
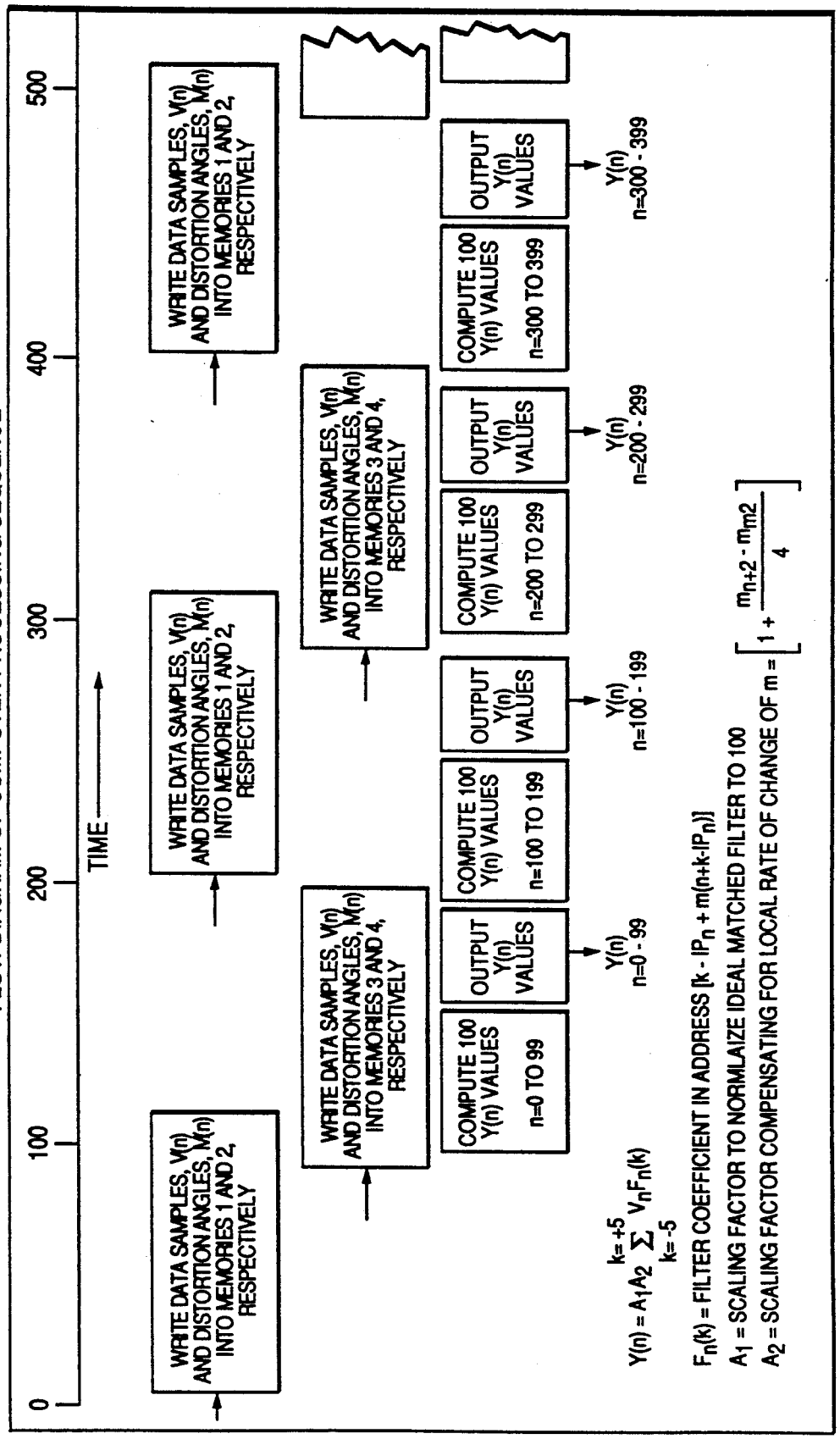
FIG. 14 is a flow diagram of a computer processing sequence for executing coefficient calculations.

FIG. 14 illustrates a method for a computer processing sequence which implements the above calculations. Scaling factor $A_1$ is used merely to normalize the output results to 100 for ease in output formatting. Scaling factor $A_2$ is equal to $F_s$ previously discussed.

The above described process has been illustrated for one-dimensional jitter error values. Similar results can, however, be realized for multi-dimensional (e.g., two-dimensional) jitter error values as detected by jitter error angle detector 40 of FIG. 4. It is of course apparent that where the rate of jitter time error is constant over a predetermined number of sample intervals, the method and apparatus of the second embodiment of the present invention discussed with respect to FIG. 10 will select a single set of weighting coefficients from ROM with the effective results being the same as described for the method and apparatus of the first embodiment.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A scanning sensor system for simultaneously correcting time varying view angle errors and suppressing sensor noise, comprising:

a scanning sensor producing a sensor output signal corresponding to an actual view angle which differs from a desired view angle by a jitter angle error;

means for detecting the jitter angle error and for generating a jitter error signal corresponding to the detected jitter angle error;

data memory means for sequentially storing data samples of the sensor output signal;

coefficient memory means for storing a plurality of sets of weighting coefficients, each weighting coefficient set being defined by a noise suppression filter impulse response;

means for selecting one of the plurality of weighting coefficient sets in accordance with the jitter error signal;

means for multiplying each of the sequentially stored data samples by a respective weighting coefficient from the selected set of weighting coefficients; and means for generating a corrected sensor output signal by summing results from the multiplying means.

2. A scanning sensor system according to claim 1, wherein the coefficient memory means comprises a read-only-memory.

3. A scanning sensor system according to claim 1, wherein the jitter error signal comprises a jitter time error signal including an integer portion comprising a nearest integer multiple of a sampling period for the data samples and a fractional portion less than the sampling period of the data samples.

4. A scanning sensor system according to claim 3, comprising:

means for delaying respective data samples by the integer portion of the jitter time error signal; and
wherein each weighting coefficient set corresponds to a respective fractional portion of the jitter time error signal.

5. A scanning sensor system according to claim 4, wherein the coefficient memory means comprises a read-only-memory (ROM) and wherein the means for selecting one of the weighting coefficient sets comprises means for addressing each weighting coefficient set in ROM in accordance with a respective fractional portion of the jitter time error signal.

6. A method of simultaneously correcting time varying view angle errors and suppressing sensor noise in a sensor output signal of a scanning sensor system, comprising the steps of:

detecting a jitter error angle as the difference between an actual view angle and a desired view angle for the scanning sensor system;
generating a jitter erro signal corresponding to the detected jitter angle error;
storing data samples of the sensor output signal in a data memory;
selecting one of a plurality of stored weighting coefficient sets in accordance with the jitter error signal, each weighting coefficient set corresponding to a noise suppression filter impulse response;
multiplying each stored data sample by a respective weighting coefficient from the selected set of weighting coefficients; and
generating a corrected sensor output signal by summing the multiplicative results.

7. The method of claim 6, wherein the step of selecting one of the plurality of weighting coefficient sets comprises the step of selecting a weighting coefficient set from read-only-memory (ROM).

8. The method of claim 7, comprising the steps of:
defining the noise suppression filter impulse response over a predetermined time period;
defining a sample interval as a predetermined subinterval of the time period;
defining a desired scan rate for the scanning sensor system as angle units per sample interval, such that the desired scan rate defines for any given time the desired view angle.

9. The method of claim 7, wherein the step of generating a jitter error signal comprises the step of converting the jitter angle error into a corresponding jitter time error, the jitter time error including an integer portion comprising a nearest integer multiple of a sample interval and a fractional portion as the additive complement to the integer portion required to obtain the jitter time error.

10. The method of claim 9, wherein the step of selecting one of the plurality of weighting coefficient sets comprises the step of addressing one of the plurality of weighting coefficient sets from ROM according to the value of the fractional portion of the jitter time error, wherein the jitter time error is constant over a predetermined number of sample intervals.

11. A scanning sensor system for simultaneously correcting time varying view angle errors and suppressing sensor noise, comprising:

a scanning sensor producing a sensor output signal cor-responding to an actual view angle which differs from a desired view angle by a jitter angle error;

means for sampling the sensor output signal at a predetermined sample interval n such that a plurality of data samples $V_1$-$V_i$ are provided for corresponding sample intervals $n_1$-$n_i$;

a data memory for sequentially storing data samples $V_1$-$V_i$;

means for selecting a set of k data samples from the stored data samples $V$ - $V_i$;

means for detecting the jitter angle error, and for generating a jitter time error signal M(n) corresponding to the detected jitter angle error, the jitter time error signal including an integer portion $IP_n$, corresponding to a nearest integer multiple of the sample interval and a fractional portion FPn, less than the sample interval;

coefficient memory means for storing a plurality of weighting coefficient sets, each weighting coefficient set being defined by a noise suppression filter impulse response;

means for selecting a weighting coefficient W(n) from the plurality of weighting coefficient sets for each respective data sample V(n) of the selected set of k data samples;

means for multiplying each respective data sample V(n) by the respective selected weighting coefficient W(n); and means for generating a corrected sensor output signal from the products of the multiplying means.

12. A scanning sensor system according to claim 11, wherein the means for selecting a set of k data samples comprises;

means for selecting a set of data samples proximate the subject data sample defined by $V[q+IP_q+r]$, where r is defined by the range of from $-(k-1)/2$ to $+(k-1)/2$.

13. A scanning sensor system according to claim 12, wherein the coefficient memory means comprises a read-only-memory (ROM) and the means for selecting a weighting coefficient comprises means for addressing the respective selected weighting coefficient W(n), for each corresponding data sample V(n) in the set of k data samples, in ROM according to an address corresponding to a value calculated as $[(k-IP_q)+M(q+k-IP_q)]$.

14. A scanning sensor system according to claim 12, wherein the means for generating a corrected sensor output signal comprises means for summing the products of the multiplying means.

15. A scanning sensor system according to claim 14, wherein the means for generating a corrected sensor output signal comprises means for scaling the summed products of the multiplying means by a scaling factor $F_s$, defined as $$F_s = \{1 + 0.25[M(q+2) - M(q-2)]\}$$

16. A method of simultaneously correcting time varying view angle errors and suppressing sensor noise in a sensor output signal of a scanning sensor system, comprising the steps of:
   sampling the sensor output signal at the sample interval n, such that a plurality of data samples $V_1$-$V_i$ are provided for corresponding sample intervals $n_1$-$n_i$;
   storing data samples $V_1$-$V_i$ in a data memory;
   selecting a set of k data samples from the stored data samples $V_1$-$V_i$;
   detecting a jitter angle error as the difference between an actual view angle and a desired view angle;
   generating a jitter time error signal M(n) corresponding to the detected jitter angle error, the jitter time error signal including an integer portion $IP_n$ corresponding to a nearest integer multiple of the sample interval and a fractional portion $FP_n$ less than the sample interval;
   selecting a weighting coefficient, W(n), from a plurality of stored weighting coefficient sets for each respective data sample V(n) of the selected set of k data samples, each weighting coefficient set being defined by a noise suppression filter impulse response;
   multiplying each respective data sample, V(n), of the selected set of k data samples by the respective selected weight-ing coefficient W(n); and
   generating a corrected sensor output signal from the multiplicative results.

17. The method of claim 16, wherein the step of selecting a set of k data samples from the stored data samples $V_1$-$V_i$, comprises the steps of:
   selecting a subject data sample V(q); and
   selecting a set of data samples proximate the subject data sample defined by $V[q + IP_q + r]$, where r is defined by the range of from $-(k-1)/2$ to $+(k-1)/2$.

18. The method of claim 16, comprising the steps of:
   defining the noise suppression filter impulse response over a predetermined time period;
   defining a sample interval as a predetermined subinterval of the time period; and
   defining a desired scan rate for the scanning sensor system as angle units per sample interval, such that the desired scan rate defines for any given time the desired view angle.

19. The method of claim 17, wherein the step of selecting weighting coefficients comprises the step of selecting the respective weighting coefficient W(n), for each corresponding data sample V(n) in the set of k data samples, by addressing in ROM according to the formula:

$$\text{Address} = [(k - IP_q) + M(q + k - IP_q)].$$

20. The method of claim 19, wherein the step of generating a corrected sensor output signal comprises the step of:
   summing the multiplicative results.

21. The method of claim 20, wherein the step of generating a corrected sensor output signal comprises the step of:
   scaling the summed multiplicative results by a scaling factor, $F_s$, defined as $F_s = \{1 + 0.25[M(q+2) - M(q-2)]\}$.

* * * * *